(12) United States Patent
Arvin et al.

(10) Patent No.: US 10,955,439 B2
(45) Date of Patent: Mar. 23, 2021

(54) ELECTROCHEMICAL CLEANING OF TEST PROBES

(71) Applicant: International Business Machines Corporation, Armonk, NY (US)

(72) Inventors: Charles L. Arvin, Poughkeepsie, NY (US); David M. Audette, Colchester, VT (US); Grant Wagner, Jericho, VT (US)

(73) Assignee: International Business Machines Corporation, Armonk, NY (US)

( * ) Notice: Subject to any disclaimer, the term of this patent is extended or adjusted under 35 U.S.C. 154(b) by 63 days.

(21) Appl. No.: 16/299,598

(22) Filed: Mar. 12, 2019

(65) Prior Publication Data

US 2020/0292577 A1   Sep. 17, 2020

(51) Int. Cl.
   *G01R 1/067*   (2006.01)
   *H01L 21/67*   (2006.01)
   (Continued)

(52) U.S. Cl.
   CPC .......... *G01R 1/06738* (2013.01); *G01R 3/00* (2013.01); *G02B 5/128* (2013.01); *G06F 3/044* (2013.01);
   (Continued)

(58) Field of Classification Search
   CPC ......... G02B 5/128; G06F 3/044; H01L 51/50; H01L 21/67017; G01R 1/06738; G01R 3/00; G01R 31/26
   (Continued)

(56) References Cited

U.S. PATENT DOCUMENTS 3,793,161 A * 2/1974 Manko .................... C25D 17/10
                                              205/252
5,152,878 A * 10/1992 Datta ........................ C25F 1/00
                                              205/717
(Continued)

FOREIGN PATENT DOCUMENTS

JP   2000097992      *  4/2000   ............. G01R 31/26
WO   WO-03076087 A1 *  9/2003   ............... B23H 9/02

OTHER PUBLICATIONS

ISR Electro-Chemical Cleaning Process for Electrical Connectors WO03076087, dated Sep. 18, 2003, 13 pages (Year: 2003).*

(Continued)

*Primary Examiner* — Clayton E. LaBalle
*Assistant Examiner* — Kevin C Butler
(74) *Attorney, Agent, or Firm* — Scully, Scott, Murphy & Presser, P.C.; Erik Johnson, Esq.

(57) ABSTRACT

A method of treating a material on a probe is provided. The method includes the steps of immersing a probe tip into a first fluid, wherein the probe tip includes one or more oxidized metallic fragments on a surface of the probe tip; polarizing the probe tip, through a counter electrode, with a negative current to reduce the one or more oxidized metallic fragments to one or more substantially unoxidized metallic fragments; removing the probe tip from the first fluid; immersing the probe in a second fluid, wherein the second fluid is a complexer for the one or more substantially unoxidized metallic fragments; and polarizing the probe tip with a positive current, through the counter electrode, wherein the positive current oxidizes the one or more substantially unoxidized metallic fragments.

20 Claims, 2 Drawing Sheets

(51) Int. Cl.
*G01R 3/00* (2006.01)
*H01L 51/50* (2006.01)
*G02B 5/128* (2006.01)
*G06F 3/044* (2006.01)

(52) U.S. Cl.
CPC ........ *H01L 21/67017* (2013.01); *H01L 51/50* (2013.01)

(58) Field of Classification Search
USPC .......................................................... 324/758
See application file for complete search history.

(56) References Cited

U.S. PATENT DOCUMENTS

| | | | | |
|---|---|---|---|---|
| 5,512,201 A | * | 4/1996 | Singh | C23F 1/44 252/79.2 |
| 5,543,032 A | * | 8/1996 | Datta | H01L 24/11 205/670 |
| 5,560,813 A | * | 10/1996 | Lin | C25D 3/60 205/253 |
| 5,911,907 A | * | 6/1999 | Campbell | C09K 13/06 252/79.1 |
| 5,958,148 A | * | 9/1999 | Holzapfel | B24B 37/013 134/113 |
| 6,258,294 B1 | * | 7/2001 | Johnson, II | C23F 1/30 252/79.3 |
| 6,857,880 B2 | * | 2/2005 | Ohtsuki | H01R 13/2414 439/66 |
| 9,057,741 B2 | * | 6/2015 | Audette | G01R 1/07314 |
| 2003/0116173 A1 | * | 6/2003 | Humenik | H01L 21/4864 134/1 |
| 2003/0116428 A1 | * | 6/2003 | Bezama | C25F 1/00 204/198 |
| 2003/0132416 A1 | * | 7/2003 | Boguslavsky | C25F 5/00 252/2 |
| 2004/0149593 A1 | * | 8/2004 | Orwoll | C25F 1/00 205/710 |

OTHER PUBLICATIONS

Preliminary Examination Report, WO03076087, PCT/US03/06906, dated Mar. 5, 2002, 4 pages (Year: 2002).*

* cited by examiner

ELECTROCHEMICAL CLEANING OF TEST PROBES

BACKGROUND

The present application generally relates to the field of methods and apparatus to clean test probes electrochemically, and more particularly to the introduction of at least two different fluids sequentially.

During wafer level testing, portions of controlled collapsed chip connections (i.e., C4 connections) adhere to the test probes during the testing. These portions of material can either carry over on the test probe and get deposited onto subsequent C4 connections during later tests, and/or these portions of material can interfere with test results of the initial C4 connection being tested.

The time it takes for the portions of material to stick onto, or adhere to, the test probes is a substantial factor that limits test probe life. It is therefore desirable to have an ability to remove these portions of material from the test probes to therefore extend probe life.

SUMMARY

In one aspect of the present application, a method for treating a material on a probe is provided. In one embodiment, the method includes immersing a probe tip into a first fluid, wherein the probe tip includes one or more oxidized metallic fragments on a surface of the probe tip. The probe tip is then polarized, through a counter electrode, with a negative current to reduce the one or more oxidized metallic fragments to one or more substantially unoxidized metallic fragments. The probe tip and the one or more substantially unoxidized metallic fragments on the probe tip are thereafter removed from the first fluid. The probe tip and the one or more substantially unoxidized metallic fragments on the probe tip are then immersed in a second fluid, wherein the second fluid is a complexer for the one or more substantially unoxidized metallic fragments. The probe tip is thereafter polarized with a positive current, through the counter electrode, wherein the positive current oxidizes the one or more substantially unoxidized metallic fragments.

In another aspect of the present application, a method for treating a material on a probe is provided. In one embodiment, the method includes heating a probe tip, wherein the probe tip includes one more oxidized metallic fragments on a surface of the probe tip, wherein the first fluid includes formic acid that reduces the one or more oxidized metallic fragments to one or more substantially unoxidized metallic fragments. The probe tip is then immersed into a first fluid. The probe tip and the one or more substantially unoxidized metallic fragments on the probe tip are thereafter removed from the first fluid. The probe tip and the one or more substantially unoxidized metallic fragments on the probe tip are then immersed in a second fluid, wherein the second fluid is a complexer for the one or more substantially unoxidized metallic fragments. The probe tip is thereafter polarized with a positive current, through the counter electrode, wherein the positive current oxidizes the one or more substantially unoxidized metallic fragments.

DETAILED DESCRIPTION

Figure 1:
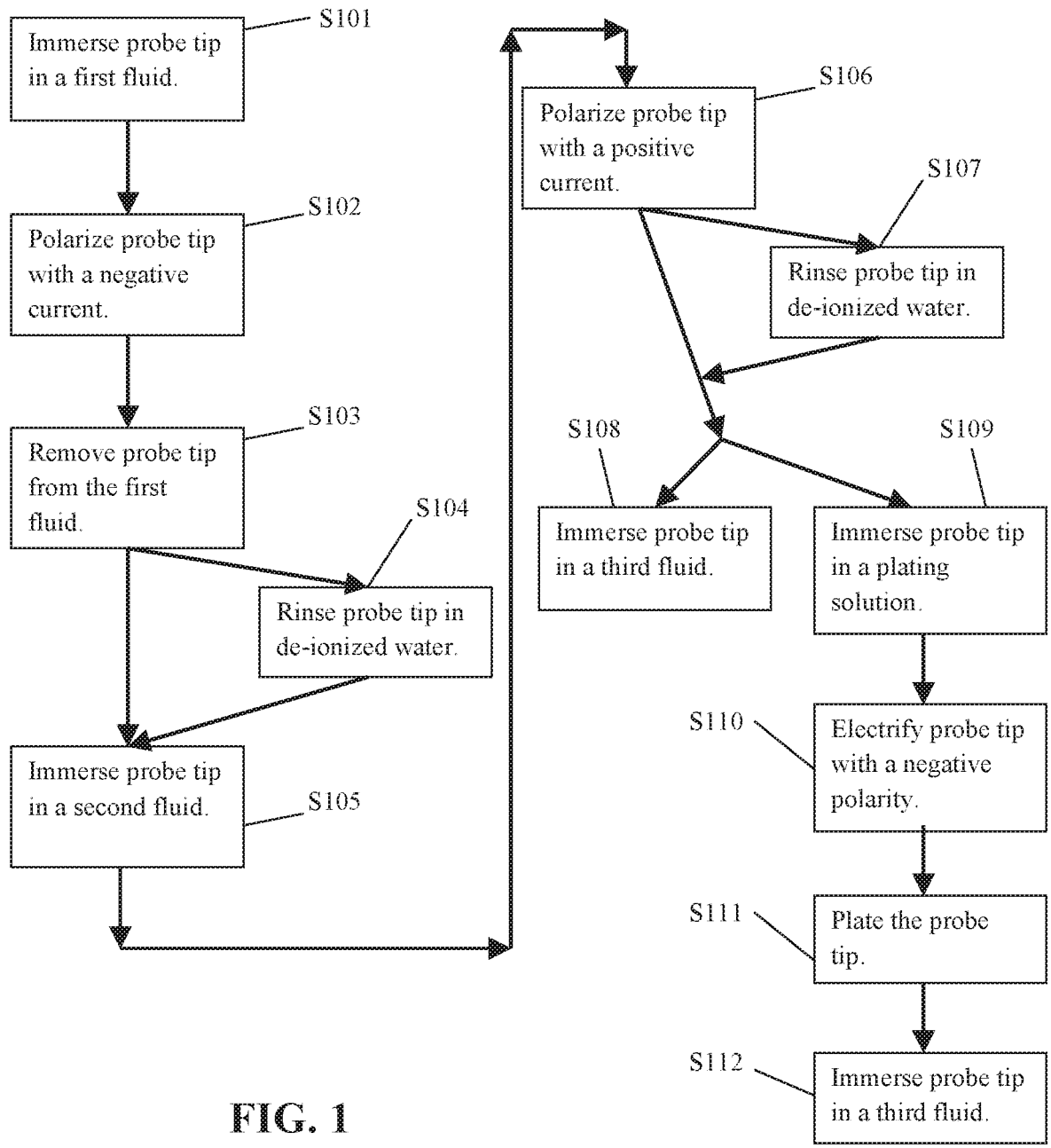
FIG. 1 is flow chart illustrating a method of one embodiment of the present application.

The present application will now be described in greater detail by referring to the following discussion and drawings that accompany the present application. It is noted that the drawings of the present application are provided for illustrative purposes only and, as such, the drawings are not drawn to scale. It is also noted that like and corresponding elements are referred to by like reference numerals.

In the discussion and claims herein, the term "about" indicates that the value listed may be somewhat altered, as long as the alteration does not result in nonconformance of the process or device. For example, for some elements the term "about" can refer to a variation of ±0.1%, for other elements, the term "about" can refer to a variation of ±1% or ±10%, or any point therein.

As used herein, the term "substantially", or "substantial", is equally applicable when used in a negative connotation to refer to the complete or near complete lack of an action, characteristic, property, state, structure, item, or result. For example, a surface that is "substantially" flat would either completely flat, or so nearly flat that the effect would be the same as if it were completely flat.

As used herein terms such as "a", "an" and "the" are not intended to refer to only a singular entity, but include the general class of which a specific example may be used for illustration.

As used herein, terms defined in the singular are intended to include those terms defined in the plural and vice versa.

References in the specification to "one embodiment", "certain embodiments", some embodiments" or "an embodiment", indicate that the embodiment(s) described may include a particular feature or characteristic, but every embodiment may not necessarily include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described. For purposes of the description hereinafter, the terms "upper", "lower", "right", "left", "vertical", "horizontal", "top", "bottom", and derivatives thereof shall relate to the invention, as it is oriented in the drawing figures. The terms "overlying", "atop", "positioned on" or "positioned atop" means that a first element, is present on a second element, wherein intervening elements interface between the first element and the second element. The term "direct contact" or "attached to" means that a first element, and a second element, are connected without any intermediary element at the interface of the two elements.

Reference herein to any numerical range expressly includes each numerical value (including fractional numbers and whole numbers) encompassed by that range. To illustrate, reference herein to a range of "at least 50" or "at least about 50" includes whole numbers of 50, 51, 52, 53, 54, 55, 56, 57, 58, 59, 60, etc., and fractional numbers 50.1, 50.2 50.3, 50.4, 50.5, 50.6, 50.7, 50.8, 50.9, etc. In a further illustration, reference herein to a range of "less than 50" or "less than about 50" includes whole numbers 49, 48, 47, 46, 45, 44, 43, 42, 41, 40, etc., and fractional numbers 49.9, 49.8, 49.7, 49.6, 49.5, 49.4, 49.3, 49.2, 49.1, 49.0, etc.

The present disclosure is directed to various methods of removing various materials from probes and the tips of those probes. The material can be considered a debris material, the removal of which can extend the useful life of the test probes. The "probe" or "test probe" can be any suitable size/shape/structure/material that is configured to perform wafer level testing of portions of controlled collapsed chip connections (i.e., C4 connections).

Also included herein as a "probe" or "test probe" is any element such as a composite interconnection element, spring contact, spring element, contact bump, or the like, suited to effect a pressure connection to terminals (e.g., bond pads) of an electronic component (e.g., a semiconductor die, including semiconductor dies resident on a semiconductor wafer).

Throughout the disclosure the term "fluid" is used, and is meant to mean solutions, liquids, gases, and combinations thereof.

The method of the first embodiment is now discussed in reference to FIG. 1, which illustrates several method steps interacting with a probe tip. Each of the steps can occur in any suitable container, with each step occurring in a different container than the container of the previous step, or, alternatively, a single container can be used for each method step. Further, all steps of moving the probe tip into and out of various fluids can occur manually, through movement of a human hand, or mechanically, either through a programmable or autonomous mechanical arm configured to move the probe tip.

The first step S101 of the method is immersing a probe tip into a first fluid, with the probe tip including one or more oxidized metallic fragments on a surface of the probe tip. These one or more oxidized metallic fragments on the surface of the probe tip could have accumulated after one or more testing of C4 connections, thus, the one or more oxidized metallic fragments on the surface of the probe tip can include solder fragments, the solder fragments themselves can include tin. As used herein, the term "immersed" refers to the probe tip being completely submerged within a fluid, or at least partially submerged within a fluid.

In step S101, the first fluid is any substantially inert fluid or any relatively weak acid, such as, but not limited to, 0.001M to 3M sodium sulfate fluid and a 0.001M to 3M sodium citrate fluid.

In step S102, the probe tip is polarized by the application of electricity through a counter electrode so that the counter electrode produces a negative current in the first fluid. This negative current is configured to be at a current density that does not allow plating or another electrochemical process to occur on the probe tip. In some embodiments, a three electrode scheme (anode, cathode and reference electrode) could be used for this step S102, and the further current steps discussed below.

Optionally, the first fluid can be de-aerated by bubbling nitrogen (or another inert gas) through the first fluid to reduce the presence of oxygen, thus reducing possible reactions at the probe tip.

In the absence of a three electrode scheme, a current density can be utilized for reducing the metal oxide. If the reaction to reduce the one or more oxidized metallic fragments on the surface of the probe tip occurs in the first fluid, the reduction at current densities between 0.01 to 0.3 mA/cm$^2$ can be obtained.

This negative current reduces the one or more oxidized metallic fragments to form one or more substantially unoxidized metallic fragments (which can be wholly unoxidized or partially unoxidized).

This step S102 can last for any amount of time that is suitable to form one or more substantially unoxidized metallic fragments from the one or more oxidized metallic fragments. An example of this amount of time is about 1 second to about 5 minutes, or about 5 seconds, or about 15 seconds, or about 30 seconds or about 1 minute, or about 2 minutes, or about 3 minutes, or about 4 minutes.

Next, in step S103, the probe tip and the one or more substantially unoxidized metallic fragments on the probe tip are removed from the first fluid.

Next, an optional step S104 is the rinsing of the probe with water, such as a deionized water. If this optional step S104 does not occur, the method steps go directly from S103 to S105.

In step S105, the probe tip, along with the one or more substantially unoxidized metallic fragments on the probe tip are immersed in a second fluid, wherein the second fluid is a complexer for the one or more substantially unoxidized metallic fragments.

In S105, the second fluid comprises any fluid that is able to complex ions of the one or more substantially unoxidized metallic fragments, including but not limited to, one or more of 0.01M to 3M methyl sulfonic acid, 0.01M to 3M sulfuric acid, 0.01M to 3M hydrochloric acid, 0.01M to 3M phosphoric acid and 0.01M to 3M oxalic acid.

In step S106, the probe tip is polarized with a positive current, through a counter electrode (or the same counter electrode as S102), wherein the positive current oxidizes the one or more substantially unoxidized metallic fragments.

This step S106 can last for any amount of time that is suitable to substantially oxidize the one or more substantially unoxidized metallic fragments, which allows for the now substantially oxidized one or more metallic fragments to separate from and be removed from the probe tip. An example of this amount of time is about 15 seconds, or about 30 seconds or about 1 minute, or about 2 minutes, or about 3 minutes, or about 4 minutes.

The time between S102 and S106 can be up to about 8 hours, or up to about 5 hours, or up to about 2 hours, or up to about 1 hour, or up to about 30 minutes, or up to about 15 minutes, or up to about 10 minutes, or up to about 5 minutes, or up to about 1 minute.

In S106, the positive current can be about 2 to 10 mA/cm$^2$. If the current is too small (i.e. <2 mA/cm$^2$), a film can grow on the probe tip if there are trace organics present. If the current is too large, with values of greater than 100 mA/cm$^2$, water can break down to oxygen and allow for an oxide to grow on the probe tip.

In S106, the second fluid can be suitable temperature, such as about 3° C. This temperature of the second fluid can reduce a metal oxidation reaction rate.

Further, in S106, the second fluid can act to oxidize the one or more substantially unoxidized metallic fragments on the probe tip (is no or little oxygen is present in the second fluid), or, the second fluid can act to dissolve the one or more substantially unoxidized metallic fragments on the probe tip from the surface of the probe tip (if oxygen is present in the second fluid).

Next, an optional step S107 is the rinsing of the probe with water, such as a deionized water. If this optional step S107 does not occur, the method steps go directly from S106 to either S108 or S107.

In step S108 the probe tip can be immersed in a third fluid, which is configured to reduce adhesion between the probe tip and solder comprising tin of C4 connectors. During future use of these test probes, the test probes will likely come into contact with solders comprising tin, thus, this coating will aid in reducing adhesion between the probe tip and the solder. This third fluid can be any suitable fluid, such as an alcohol, or a poly vinyl alcohol (PVA). After S108, the method is ended.

Alternatively to S108, after S106 (or S107), the process can proceed to S109, in which the probe tip is immersed in a metal plating fluid. The metal plating fluid can be any fluid containing one or more kinds of metal ions that are desirable for plating, such as gold ions.

Next, in S110, the probe tip is electrified with a negative polarity. In addition to electrifying the probe tip with a negative polarity, the counter electrode (which may be the same counter electrode of S102, or a different counter electrode) can be electrified to form a positive polarity.

Next, in S111, after a period of time of electricity being provided to the probe tip, the probe tip becomes plated with the one or more kinds of metal ions. After plating, in S112, the probe tip can be immersed in the third fluid described in S108, and then the method is ended.

Figure 2:
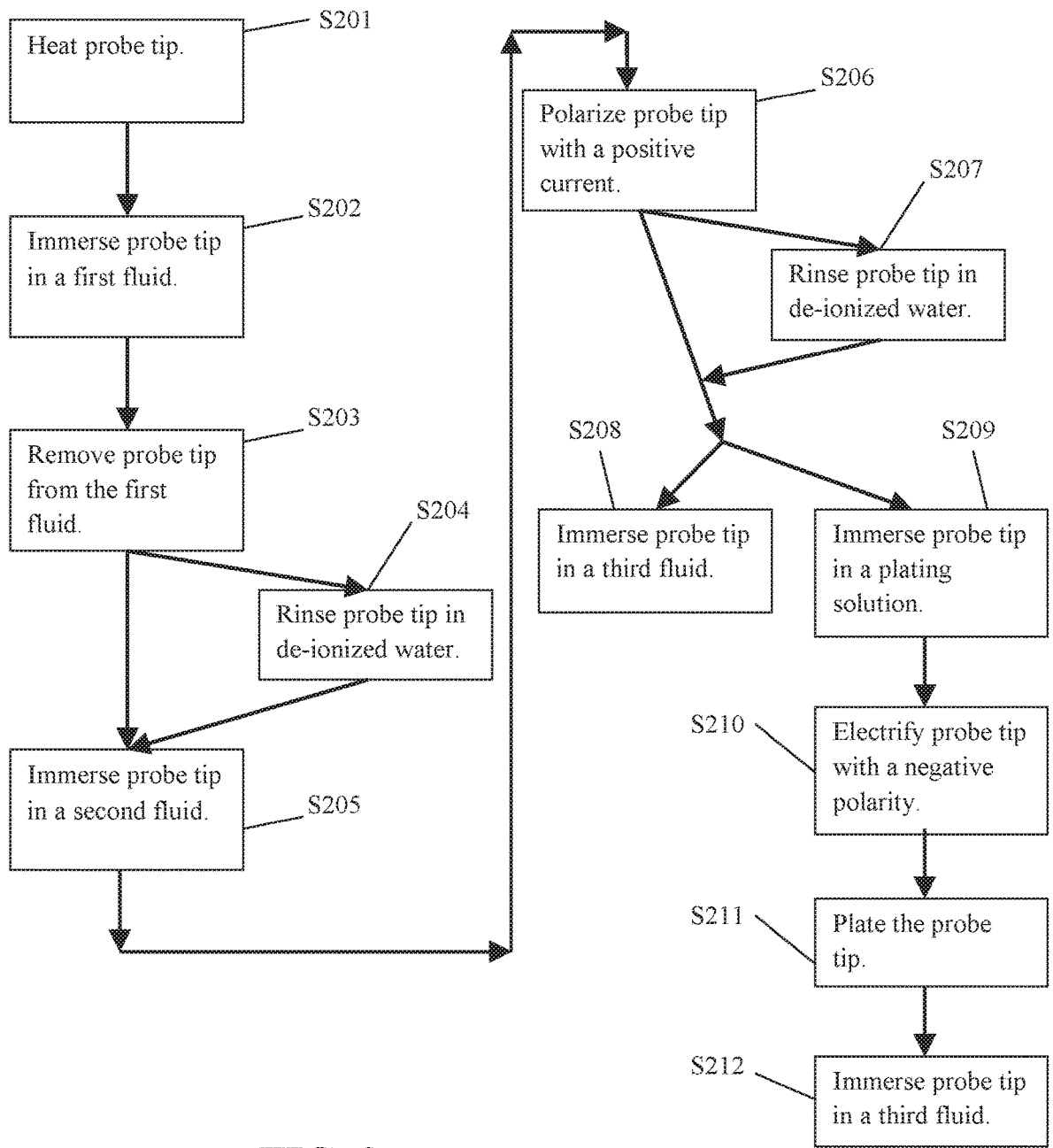
FIG. 2 is flow chart illustrating a method of one embodiment of the present application.

The method of the second embodiment is now discussed in reference to FIG. 2, which illustrates several method steps interacting with a probe tip. Each of the steps can occur in any suitable container, with each step occurring in a different container than the container of the previous step, or, alternatively, a single container can be used for each method step.

The first step S201 is heating the probe tip, with the probe tip comprising one or more oxidized metallic fragments on a surface of the probe tip. These one or more oxidized metallic fragments on the surface of the probe tip could have accumulated after one or more testing of C4 connections, thus, the one or more oxidized metallic fragments on the surface of the probe tip can include solder fragments, the solder fragments themselves can include tin.

The probe tip can be heated to any suitable temperature that allows for the reduction of the one or more oxidized metallic fragments on the surface of the probe tip, such as about 100° C. to about 200° C., or about 120° C. to about 150° C.

Next, in step S202, the probe tip and the one or more oxidized metallic fragments are immersed into a first fluid. In step S202, the first fluid is a formic acid that reduces the one or more oxidized metallic fragments to one or more substantially unoxidized metallic fragments. The first fluid that the probe tip is immersed in can be formed as a vapor phase reduction, with nitrogen (or one or more other inert gases) being bubbled through a formic acid liquid to form a nitrogen gas/formic acid fluid.

These steps, the combination of S201 and S202, is an alternative to the combination of S101 and S102, with both (S201+S202) and (S101+S102) acting to reduce the one or more oxidized metallic fragments.

This step S202 can last for any amount of time that is suitable to form one or more substantially unoxidized metallic fragments from the one or more oxidized metallic fragments. An example of this amount of time is about 1 second to about 5 minutes, or about 5 seconds, or about 15 seconds, or about 30 seconds or about 1 minute, or about 2 minutes, or about 3 minutes, or about 4 minutes.

Next, in step S203, the probe tip and the one or more substantially unoxidized metallic fragments on the probe tip are removed from the first fluid.

Next, an optional step S204 is the rinsing of the probe with water, such as a deionized water. If this optional step S204 does not occur, the method steps go directly from S203 to S205.

In step S205, the probe tip, along with the one or more substantially unoxidized metallic fragments on the probe tip are immersed in a second fluid, wherein the second fluid is a complexer for the one or more substantially unoxidized metallic fragments.

In S205, the second fluid comprises any fluid that is able to complex ions of the one or more substantially unoxidized metallic fragments, including but not limited to, one or more of 0.01M to 3M methyl sulfonic acid, 0.01M to 3M sulfuric acid, 0.01M to 3M hydrochloric acid, 0.01M to 3M phosphoric acid and 0.01M to 3M oxalic acid.

In step S206, the probe tip is polarized with a positive current, through a counter electrode, wherein the positive current oxidizes the one or more substantially unoxidized metallic fragments.

This step S206 can last for any amount of time that is suitable to substantially oxidize the one or more substantially unoxidized metallic fragments, which allows for the now substantially oxidized one or more metallic fragments to separate from and be removed from the probe tip. An example of this amount of time is about 15 seconds, or about 30 seconds or about 1 minute, or about 2 minutes, or about 3 minutes, or about 4 minutes.

The time between S202 and S206 can be up to about 8 hours, or up to about 5 hours, or up to about 2 hours, or up to about 1 hour, or up to about 30 minutes, or up to about 15 minutes, or up to about 10 minutes, or up to about 5 minutes, or up to about 1 minute.

Further, in S206, the second fluid can act to oxidize the one or more substantially unoxidized metallic fragments on the probe tip (is no or little oxygen is present in the second fluid), or, the second fluid can act to dissolve the one or more substantially unoxidized metallic fragments on the probe tip from the surface of the probe tip (if oxygen is present in the second fluid).

Next, an optional step S207 is the rinsing of the probe with water, such as a deionized water. If this optional step S207 does not occur, the method steps go directly from S206 to either S208 or S207.

In step S208 the probe tip can be immersed in a third fluid, which is configured to reduce adhesion between the probe tip and solder comprising tin of C4 connectors. During future use of these test probes, they will likely come into contact with solders comprising tin, thus, this coating will aid in reducing adhesion between the probe tip and the solder. This third fluid can be any suitable fluid, such as an alcohol, or a poly vinyl alcohol (PVA). After S208, the method is ended.

Alternatively to S208, after S206 (or S207), the process can proceed to S209, in which the probe tip is immersed in a metal plating fluid. The metal plating fluid can be any fluid containing one or more kinds of metal ions that are desirable for plating, such as gold ions.

Next, in S210, the probe tip is electrified with a negative polarity. In addition to electrifying the probe tip with a negative polarity, the counter electrode (which may be the same counter electrode of S206, or a different counter electrode) can be electrified to form a positive polarity.

Next, in S211, after a period of time of electricity being provided to the probe tip, the probe tip becomes plated with the one or more kinds of metal ions. After plating, in S212, the probe tip can be immersed in the third fluid described in S208, and then the method is ended.

While the present application has been particularly shown and described with respect to preferred embodiments thereof, it will be understood by those skilled in the art that the foregoing and other changes in forms and details may be made without departing from the spirit and scope of the present application. It is therefore intended that the present application not be limited to the exact forms and details described and illustrated, but fall within the scope of the appended claims.

What is claimed is:

1. A method of treating a material on a probe, the method comprising:
   immersing a probe tip into a first fluid, wherein the probe tip comprises one or more oxidized metallic fragments on a surface of the probe tip;
   polarizing the probe tip, through a counter electrode, with a negative current to reduce the one or more oxidized metallic fragments to one or more substantially unoxidized metallic fragments;
   removing the probe tip and the one or more substantially unoxidized metallic fragments on the probe tip from the first fluid;
   immersing the probe tip and the one or more substantially unoxidized metallic fragments on the probe tip in a second fluid, wherein the second fluid is a complexer for the one or more substantially unoxidized metallic fragments; and
   polarizing the probe tip with a positive current in the range of about 2 mA/cm$^2$ to about 10 mA/cm$^2$, through the counter electrode, wherein the positive current oxidizes the one or more substantially unoxidized metallic fragments.

2. The method of claim 1, wherein the one or more metallic fragments comprises tin.

3. The method of claim 1, wherein the first fluid is substantially inert.

4. The method of claim 1, wherein the first fluid comprises one or more of a 0.001M to 3M sodium sulfate fluid and a 0.001M to 3M sodium citrate fluid.

5. The method of claim 1, wherein after the removing the probe tip from the first fluid step, the probe tip is rinsed with de-ionized water.

6. The method of claim 1, wherein the step of polarizing the probe tip with a positive current forms an oxidized one or more metallic fragments, which separate from the probe tip.

7. The method of claim 1, wherein the second fluid comprises one or more of 0.01M to 3M methyl sulfonic acid, 0.01M to 3M sulfuric acid, 0.01M to 3M hydrochloric acid, 0.01M to 3M phosphoric acid and 0.01M to 3M oxalic acid.

8. The method of claim 1, wherein after the removing the probe tip from the second fluid step, the probe tip is rinsed with de-ionized water.

9. The method of claim 1, wherein the after the removing the probe tip from the second fluid step, the probe tip is immersed in a third fluid, the third fluid configured to reduce adhesion between the probe tip and a solder comprising tin.

10. The method of claim 1, wherein after the step of polarizing the probe tip with a positive current, the method comprises the further steps of:
    immersing the probe tip in a metal plating fluid;
    electrifying the counter electrode to form a negative polarity or a positive polarity; and
    plating the probe tip.

11. The method of claim 1, wherein first fluid is a vapor phase of formic acid and nitrogen gas.

12. The method of claim 1, wherein the step of polarizing the probe tip with a positive current forms an oxidized one or more metallic fragments, which separate from the probe tip.

13. A method of treating a material on a probe, the method comprising:
    heating a probe tip, wherein the probe tip comprises one more oxidized metallic fragments on a surface of the probe tip, wherein the first fluid comprises formic acid that reduces the one or more oxidized metallic fragments to one or more substantially unoxidized metallic fragments;
    immersing the probe tip into a first fluid;
    removing the probe tip and the one or more substantially unoxidized metallic fragments on the probe tip from the first fluid;
    immersing the probe tip and the one or more substantially unoxidized metallic fragments on the probe tip in a second fluid, wherein the second fluid is a complexer for the one or more substantially unoxidized metallic fragments; and
    polarizing the probe tip with a positive current in the range of about 2 mA/cm$^2$ to about 10 mA/cm$^2$, through a counter electrode, wherein the positive current oxidizes the one or more substantially unoxidized metallic fragments.

14. The method of claim 13, wherein the one or more metallic fragments comprises tin.

15. The method of claim 13, wherein the first fluid is heated to about 120° C. to about 150° C.

16. The method of claim 13, wherein after the removing the probe tip from the first fluid step, the probe tip is rinsed with de-ionized water.

17. The method of claim 13, wherein the second fluid comprises one or more of 0.01M to 3M methyl sulfonic acid, 0.01M to 3M sulfuric acid, 0.01M to 3M hydrochloric acid, 0.01M to 3M phosphoric acid and 0.011M to 3M oxalic acid.

18. The method of claim 13, wherein after the removing the probe tip from the second fluid step, the probe tip is rinsed with de-ionized water.

19. The method of claim 13, wherein the after the removing the probe tip from the second fluid step, the probe tip is immersed in a third fluid, the third fluid configured to reduce adhesion between the probe tip and solders comprising tin.

20. The method of claim 13, wherein after the step of polarizing the probe tip with a positive current, the method comprises the further steps of:
    immersing the probe tip in a metal plating fluid;
    electrifying the counter electrode to form a negative polarity or a positive polarity; and
    plating the probe tip.

* * * * *